(12) United States Patent
Weichert et al.

(10) Patent No.: US 7,884,950 B2
(45) Date of Patent: Feb. 8, 2011

(54) SUBSTRATE PROCESSING METHOD, PROGRAM, COMPUTER-READABLE STORAGE MEDIUM, AND SUBSTRATE PROCESSING SYSTEM

(75) Inventors: Heiko Weichert, Dresden (DE); Kunie Ogata, Koshi (JP); Tsuyoshi Shibata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 270 days.

(21) Appl. No.: 12/300,135

(22) PCT Filed: May 11, 2007

(86) PCT No.: PCT/JP2007/059722

§ 371 (c)(1),
(2), (4) Date: Nov. 10, 2008

(87) PCT Pub. No.: WO2007/132758

PCT Pub. Date: Nov. 22, 2007

(65) Prior Publication Data

US 2009/0181316 A1 Jul. 16, 2009

(30) Foreign Application Priority Data

May 17, 2006 (JP) .............................. 2006-137578

(51) Int. Cl.
*G01B 11/14* (2006.01)
*G01B 11/28* (2006.01)

(52) U.S. Cl. ....................................... 356/625; 356/630
(58) Field of Classification Search ................. 356/625, 356/630
See application file for complete search history.

(56) References Cited

U.S. PATENT DOCUMENTS

2005/0058775 A1 * 3/2005 Oku et al. .................. 427/240

FOREIGN PATENT DOCUMENTS

| JP | 64 89434 | 4/1989 |
|---|---|---|
| JP | 5 102031 | 4/1993 |
| JP | 2001 196298 | 7/2001 |
| JP | 2005 315742 | 11/2005 |

* cited by examiner

*Primary Examiner*—Roy Punnoose
(74) *Attorney, Agent, or Firm*—Oblon, Spivak, McClelland, Maier & Neustadt, L.L.P.

(57) ABSTRACT

In a pattern measuring unit installed in a coating and developing treatment system, the height of a pattern formed on a substrate is measured using the Scatterometry method. Based on the measured height of the pattern, an appropriate number of rotations of the substrate during application of a coating solution is calculated, so that the rotation of the substrate during the application is controlled by the calculated number of rotations of the substrate. Since the number of rotations of the substrate when the coating solution is applied to the substrate is controlled, it is unnecessary to stop the system which performs photolithography processing on the substrate, resulting in improved productivity of the substrate.

10 Claims, 5 Drawing Sheets

SUBSTRATE PROCESSING METHOD, PROGRAM, COMPUTER-READABLE STORAGE MEDIUM, AND SUBSTRATE PROCESSING SYSTEM

TECHNICAL FIELD

The present invention relates to a substrate processing method, a program, a computer-readable storage medium, and a substrate processing system.

BACKGROUND ART

In photolithography processing in manufacturing, for example, a semiconductor device, for example, resist coating treatment of applying a resist solution onto a semiconductor wafer (hereinafter, referred to as a "wafer") to form a resist film, exposure processing of exposing a predetermined pattern on the resist film, heat-processing of accelerating the chemical reaction in the resist film after the exposure, and developing treatment of developing the exposed resist film are performed in sequence to form a predetermined resist pattern on the wafer.

As a method of applying the resist solution onto the wafer, for example, a method called a spin coating method has been conventionally used. The spin coating method is a method of suction-holding a wafer on a disk-shaped holding member called a spin chuck, discharging a resist solution in a solution form onto an almost center of the wafer, and then rotating the spin chuck. By rotating the spin chuck, the resist solution supplied on the center is spread by the centrifugal force and applied over the entire front surface of the wafer.

To preferably implement predetermined photoplithography processing, it is important that the resist film applied on the wafer has a predetermined film thickness. Hence, conventionally, the film thickness of the resist film on the wafer is measured before the predetermined pattern is exposed on the resist film, so that when the thickness exceeds a predetermined permissible value, for example, the number of rotations of the spin chuck in the resist coating unit which applies the resist solution is corrected based on the measurement result (Patent Document 1).

[Patent Document] Japanese Patent Application Laid-open No. 2001-196298

DISCLOSURE OF THE INVENTION

Problems to Be Solved by the Invention

However, a flat region is necessary on the wafer to implement such a film thickness measurement of the resist film, but the correct film thickness cannot be measured because a resist pattern has been formed on a product wafer after the photolithography processing has been performed.

Hence, conventionally, the system which performs the photolithography processing on the product wafer is stopped and a test wafer is loaded to the system which performs the photolithography processing, so that a resist film is formed on the wafer and the film thickness on the test wafer is then measured before exposure of a pattern. Thereafter, based on the measurement result of the film thickness of the resist film on the test wafer, the number of rotations of the wafer (the number of rotations of the spin chuck) in the resist coating unit in the system is corrected, for example, if the film thickness exceeds a permissible value. In this case, because the system which performs the photolithography processing on the product wafer is stopped as described above during the measurement of the film thickness of the resist film on the test wafer, the productivity of the wafer decreases.

The present invention has been developed in consideration of the above points, and its object is to eliminate the necessity to stop a system which performs the photolithography processing even when controlling the number of rotations of a substrate such as a wafer or the like during application of a coating solution onto the substrate so as to improve the productivity of the substrate.

Means for Solving the Problems

To achieve the above object, the present invention is a substrate processing method of performing photolithography processing on a substrate including steps of rotating the substrate and applying a coating solution onto the substrate, the method further including the steps of measuring a height of a predetermined pattern formed on the substrate; and controlling at least one of a number of rotations, a rotation time, and a rotation acceleration of the substrate in the step of applying the coating solution, based on the height of the predetermined pattern.

According to the findings of the inventors, it has been revealed that the height of the predetermined pattern formed on the substrate after completion of the photolithography processing is in an almost constant correlation with the film thickness of the resist film, Accordingly, in the present invention, the height of the pattern after the photolithography processing is measured, so that at least one of the number of rotations, the rotation time, and the rotation acceleration of the substrate in the step of applying the coating solution is controlled based on the measurement result.

For example, when the measurement result of the height of the pattern exceeds a predetermined permissible value, at least one of the number of rotations, the rotation time, and the rotation acceleration of the substrate is corrected in the control unit. This eliminates the necessity to separately supply a substrate for test to a photolithography processing system to measure the film thickness of the resist film in order to control the number of rotations of the substrate like the prior art. Accordingly, it becomes unnecessary to stop the system which performs the photolithography processing on a substrate for product to improve the productivity of the substrate.

The measurement of the height of the predetermined pattern may be performed using the Scatterometry method. The Scatterometry method here means the following method. The heights of patterns and a plurality of calculatory light intensity distributions for different pattern heights are calculated for arbitrary pattern forms, for example, based on known information such as the optical constant of the resist, the pattern form of the resist, the structure and so on, and a library of them is created in advance including the information on the heights of the patterns. Then, light is applied to an actual pattern that is an object to be measured, and the intensity distribution of reflected light reflected from the pattern is measured. Matching of the measurement result with the calculatory light intensity distributions in the library is performed, and the height of the pattern in the library having a matched light intensity distribution is assumed to be the height of the actual pattern. The use of this method makes it possible to measure the height of a predetermined pattern on the substrate by pattern matching utilizing the library even when the pattern formed on the substrate becomes finer. Further, as compared to the CD-SEM method including the information such as the roughness (LWR), the shrinkage (Shrink) and so on of the pattern in measurement of the height of the pattern, the Scatterometry method does not include those kinds of information and is therefore excellent in accuracy in height of the pattern to be measured.

The measurement of the height of the predetermined pattern may be performed for each substrate. This gradually improves the accuracy of correction for at least one of the number of rotations, the rotation time, and the rotation acceleration of the substrate in the step of applying the coating solution onto the substrate and improves the accuracy of the predetermined pattern to be formed on the substrate after the photolithography processing has been performed.

The substrate processing method may be embodied as a computer program for causing a computer to control. The computer program may be stored in a computer-readable storage medium.

According to another aspect, the present invention is a substrate processing system including a coating unit for rotating a substrate and applying a coating solution onto the substrate and a developing unit for developing a predetermined pattern on the substrate, the system further including a control unit for controlling at least one of a number of rotations, a rotation time, and a rotation acceleration of the substrate in the coating unit, based on a height of the predetermined pattern.

The height of the predetermined pattern may be measured by a pattern measuring unit, and the pattern measuring unit may be a unit performing the measurement by a Scatterometry method.

The pattern measuring unit may be installed in the substrate processing system. This makes it possible to measure, in line, the height of the predetermined pattern formed on the substrate after the photolithography processing is performed, thereby smoothly performing the substrate processing.

EFFECT OF THE INVENTION

According to the present invention, at least one of the number of rotations, the rotation time, and the rotation acceleration of the substrate in the step of applying a coating solution is controlled from the height of the predetermined pattern formed on the substrate after the photolithography processing is performed, so that it is unnecessary to perform measurement of the film thickness of the resist film on the substrate using a test wafer which has been conventionally performed. Accordingly, it is unnecessary to stop the system which performs the photolithography processing, resulting in improved productivity of the substrate.

EXPLANATION OF CODES 1 coating and developing treatment system
20 pattern measuring unit
40, 41, 42 resist coating unit
50, 51, 52, 53, 54 developing treatment unit
130 control unit
W wafer

BEST MODE FOR CARRYING OUT THE INVENTION

Figure 1:
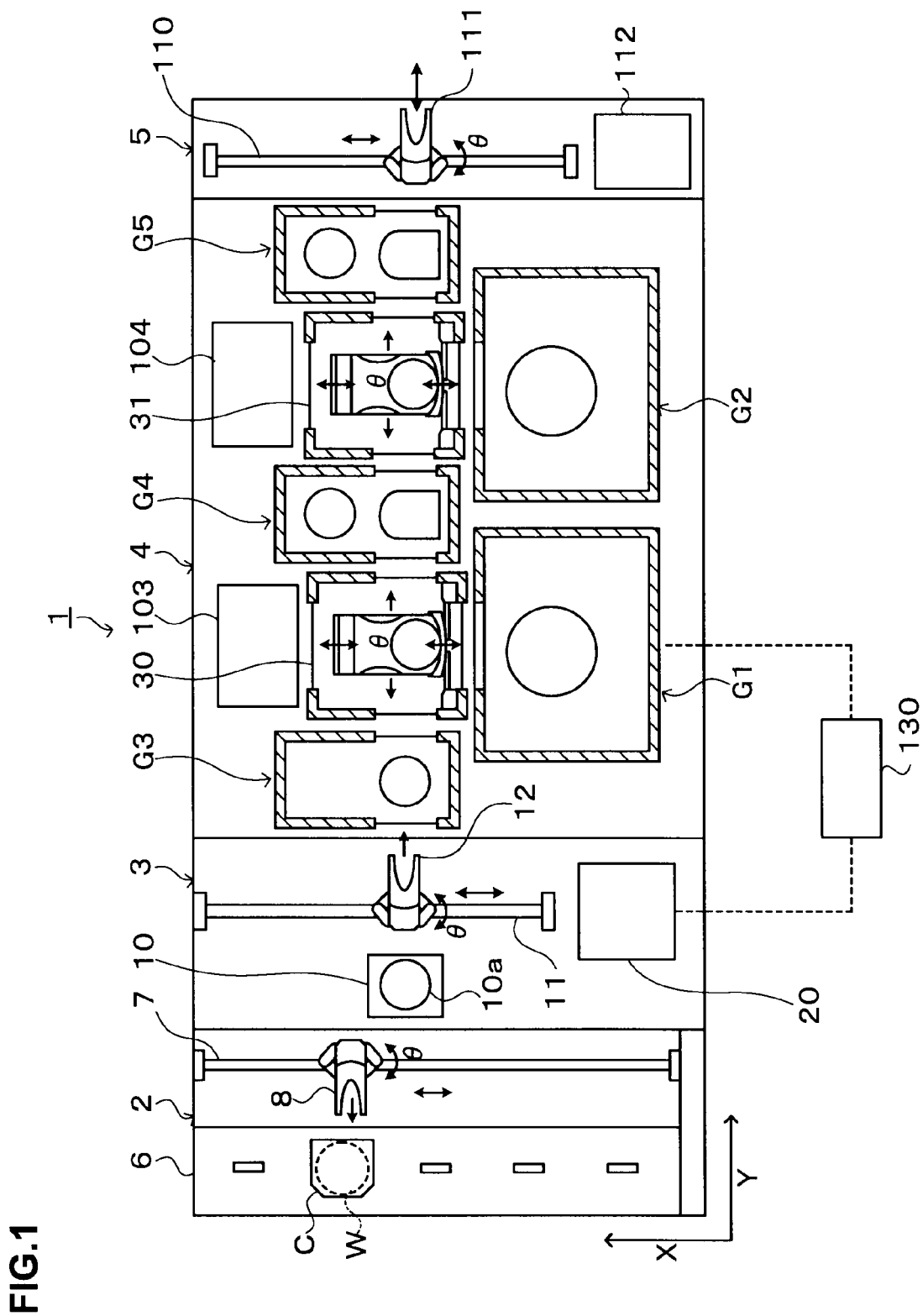
FIG. 1 A plan view showing the outline of a configuration of a coating and developing treatment system in which a pattern measuring unit according to this embodiment is installed.
Figure 2:
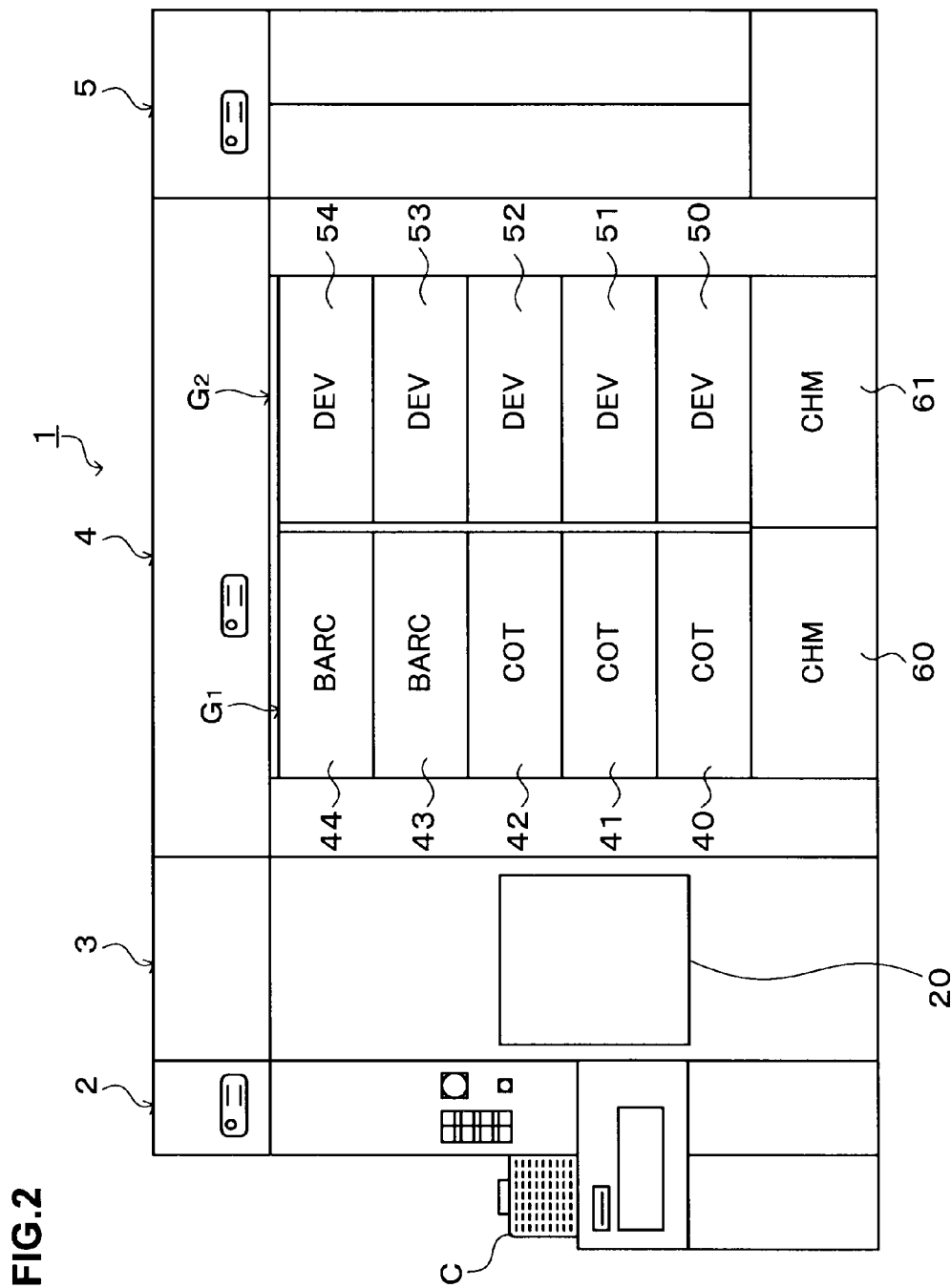
FIG. 2. A front view of the coating and developing treatment system according to this embodiment.
Figure 3:
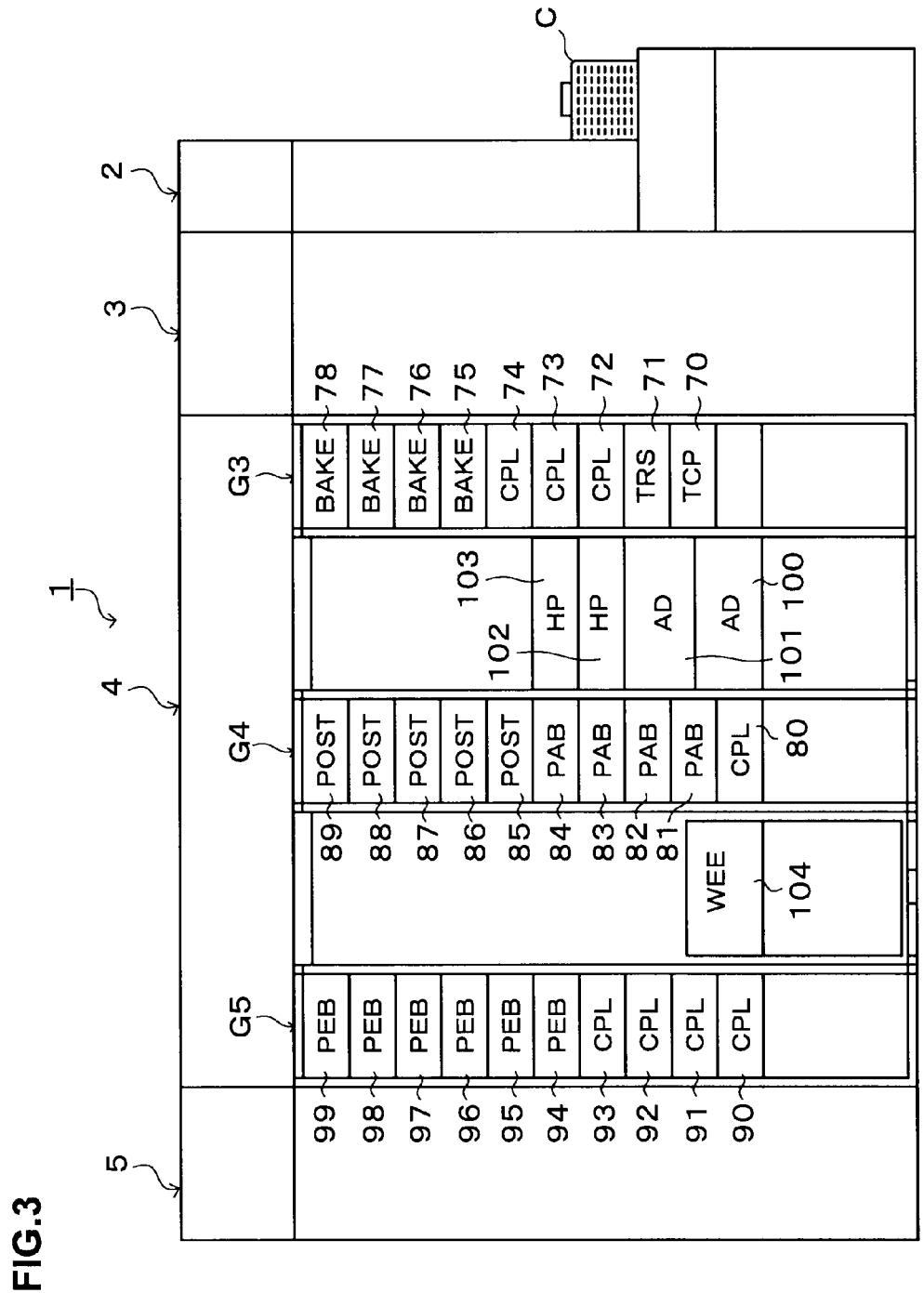
FIG. 3 A rear view of the coating and developing treatment system according to this embodiment.

Hereinafter, a preferred embodiment of the present invention will be described. FIG. 1 is a plan view showing the outline of a configuration of a coating and developing treatment system 1 as a substrate processing system according to this embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/from a cassette C; an inspection station 3 for performing predetermined inspection on the wafers W; a processing station 4 including a plurality of various kinds of treatment and processing units, which are multi-tiered, for performing predetermined treatment or processing on the wafers W in a manner of single wafer processing in the photolithography process; and an interface section 5 for delivering the wafers W to/from an aligner (not shown) provided adjacent to the processing station 4, are integrally connected.

In the cassette station 2, a cassette mounting table 6 is provided so that a plurality of cassettes C can be mounted on the cassette mounting table 6 in a line in an X-direction (a top-to-bottom direction in FIG. 1). In the cassette station 2, a wafer transfer body 8 is provided which is movable in the X-direction on a transfer path 7. The wafer transfer body 8 is movable also in an arrangement direction of the wafers W housed in the cassette C (a Z-direction; the vertical direction), and thus can selectively access the wafers W vertically arranged in the cassette C. The wafer transfer body 8 is also rotatable around an axis in the vertical direction (a θ-direction), and can access a later-described delivery unit 10 on the inspection station 3 side.

In the inspection station 3 adjacent to the cassette station 2, a pattern measuring unit 20 according to the present invention is provided. The pattern measuring unit 20 is disposed, for example, on the side of a negative direction in the X-direction (the lower direction in FIG. 1) in the inspection station 3. On the cassette station 2 side in the inspection station 3, the delivery unit 10 is located for delivering the wafer W to/from the cassette station 2. The delivery unit 10 is provided with a mounting part 10a on which, for example, the wafer W is mounted. On the side of a positive direction in the X-direction (the upper direction in FIG. 1) of the pattern measuring unit 20, for example, a wafer transfer unit 12 is provided which is movable along the X-direction, for example, on a transfer path 11. The wafer transfer unit 12 is, for example, movable in the vertical direction and rotatable also in the θ-direction to be able to access the pattern measuring unit 20, the delivery unit 10, and later-described processing units in a third processing unit group G3 on the processing station 4 side.

The processing station 4 adjacent to the inspection station 3 includes, for example, five processing unit groups G1 to G5 in each of which a plurality of treatment and processing units are multi-tiered. On the side of the negative direction in the X-direction (the lower direction in FIG. 1) in the processing station 4, the first processing unit group G1 and the second processing unit group G2 are arranged in order from the inspection station 3 side. On the side of the positive direction in the X-direction (the upper direction in FIG. 1) in the processing station 4, the third processing unit group G3, the fourth processing unit group G4, and the fifth processing unit group G5 are arranged in order from the inspection station 3 side. Between the third processing unit group G3 and the fourth processing unit group G4, a first transfer unit 30 is provided. The first transfer unit 30 can selectively access the treatment and processing units in the first processing unit group G1, the third processing unit group G3, and the forth processing unit group G4 and transfer the wafer W to them. Between the fourth processing unit group G4 and the fifth processing unit group G5, a second transfer unit 31 is provided. The second transfer unit 31 can selectively access the second processing unit group G2, the fourth processing unit group G4, and the fifth processing unit group G5 and transfer the wafer W to them.

As shown in FIG. 2, in the first processing unit group G1, solution treatment units for supplying a predetermined treatment solution onto the wafer W to thereby perform treatment, for example, resist coating units 40, 41, and 42 each for applying a resist solution onto the wafer W to form a resist film, and bottom coating units 43 and 44 each for forming an anti-reflection film which prevents reflection of light during exposure processing, are five-tiered in order from the bottom. In the second processing unit group G2, solution treatment units, for example, developing treatment units 50 to 54 each for supplying a developing solution to the wafer W to develop the wafer W are five-tiered in order from the bottom. Further, chemical chambers 60 and 61 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, a temperature regulating unit 70, a transition unit 71 for passing the wafer W, high-precision temperature regulating units 72 to 74 each for regulating the temperature of the wafer W under temperature control with a high precision, and high-temperature thermal processing units 75 to 78 each for heating the wafer W at a high temperature, are nine-tiered in order from the bottom.

In the fourth processing unit group G4, for example, a high-precision temperature regulating unit 80, pre-baking units 81 to 84 each for heat-processing the wafer W after the resist coating treatment, and post-baking units 85 to 89 each for heat-processing the wafer W after the developing treatment are ten-tiered in order from the bottom.

In the fifth processing unit group G5, a plurality of thermal processing units each for thermally processing the wafer W, for example, high-precision temperature regulating unit 90 to 93 and post-exposure baking units 94 to 99 are ten-tiered in order form the bottom.

As shown in FIG. 1, on the side of the positive direction in the X-direction of the first transfer unit 30, a plurality of treatment and processing units are arranged, for example, adhesion units 100 and 101 each for performing hydrophobic treatment on the wafer W and heat processing units 102 and 103 each for heat-processing the wafer W being four-tiered in order from the bottom as shown in FIG. 3. As shown in FIG. 1, on the side of the positive direction in the X-direction of the second transfer unit 31, for example, an edge exposure unit 104 for selectively exposing only the edge portion of the wafer W is located.

In the interface section 5, as shown in FIG. 1, for example, a wafer transfer body 111 moving on a transfer path 110 extending in the X-direction and a buffer cassette 112 are provided. The wafer transfer body 111 is movable in the Z-direction and also rotatable in the θ-direction and thus can access the aligner (not shown) adjacent to the interface section 5, the buffer cassette 112, and the fifth processing unit group G5 and transfer the wafer W to them.

Figure 4:
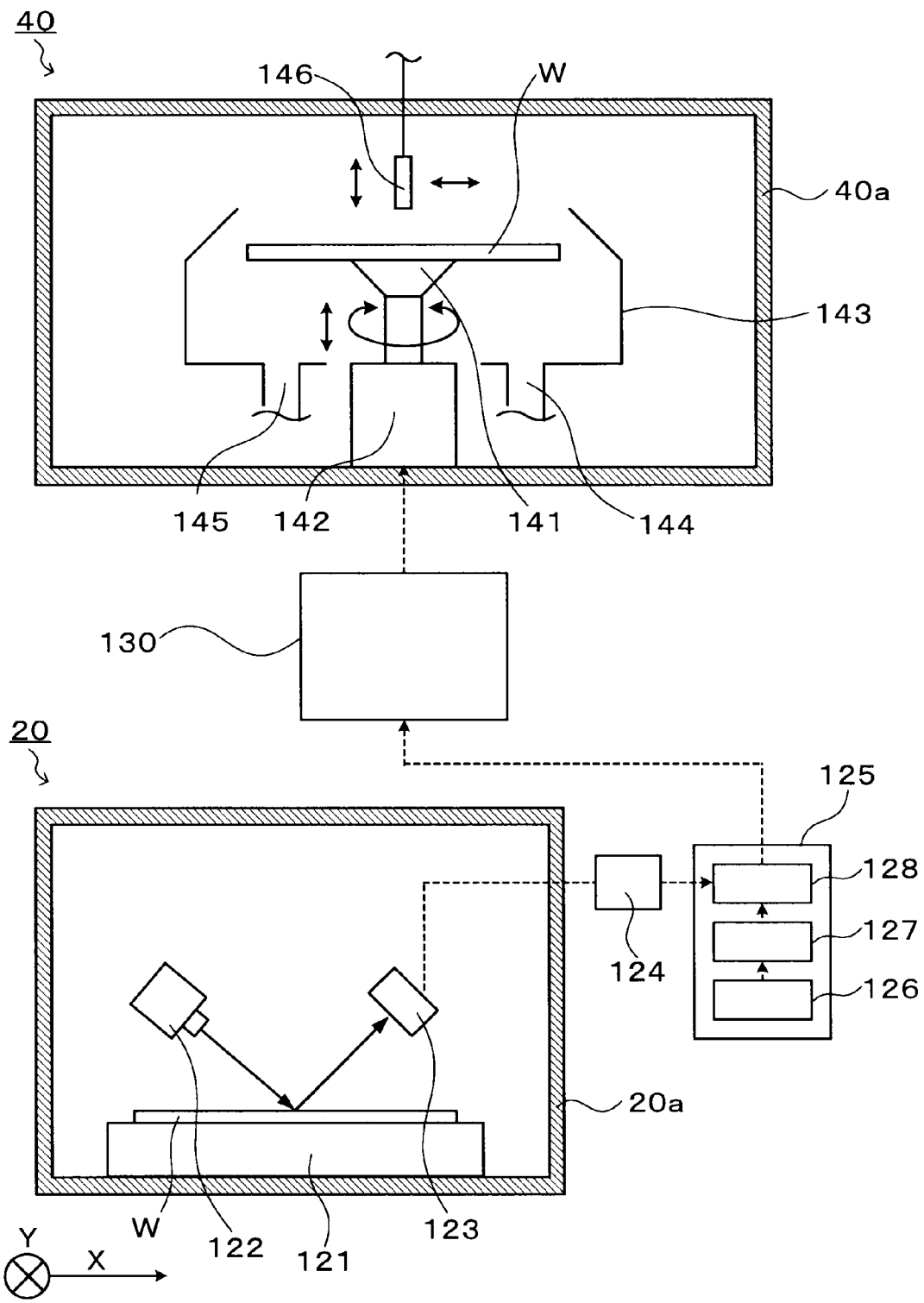
FIG. 4 A longitudinal sectional view showing the outline of configurations of a pattern measuring unit, a control unit and a resist coating unit according to this embodiment.

Next, the configuration of the above-described pattern measuring unit 20 will be described. The pattern measuring unit 20 has, for example, a casing 20a whose inside can be closed as shown in FIG. 4. In the casing 20a, a mounting table 121 for horizontally mounting the wafer W thereon is provided. The mounting table 121 constitutes, for example, an X-Y stage and can thus move in the X-direction and the Y-direction on a horizontal plane. Above the mounting table 121, a light applying part 122 for applying light in a slanting direction onto the wafer W mounted on the mounting table 121, and a detecting part 123 for detecting light applied from the light applying part 122 and reflected off the wafer W are provided.

Figure 5:
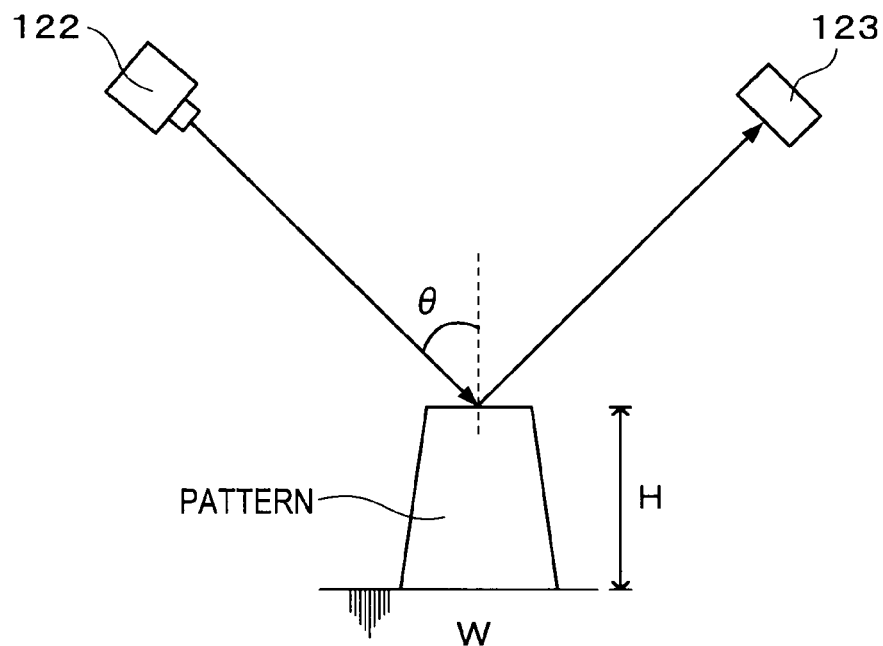
FIG. 5 An explanatory view showing reflection of light applied on a pattern.

Explaining in details based on FIG. 5, the light applied from the light applying part 122 is reflected off the pattern on the wafer W and reaches the detection part 123. The information of light detected by the detecting part 123 is outputted to a measuring part 124. The information of light includes, for example, the diffraction order, wavelength, incident angle θ and so on of the light. The measuring part 124 can measure the light intensity distribution of the reflected light reflected from a predetermined pattern formed on the wafer W based on the acquired information of the light. Note that, for example, a xenon lamp which emits white light is used as the light the light applying part 122, and a CCD camera or the like is used as the detecting part 123. Though the light is applied from the light applying part 122 in a slanting direction and reflected off the pattern on the wafer W in this embodiment, light may be applied from the light applying part 122 in the vertical direction and reflected off the pattern on the wafer W.

The pattern measuring unit 20 includes a control mechanism 125 for processing information to measure, for example, a height H of the pattern. The control mechanism 125 has, for example, a calculating part 126, a storing part 127, and an analyzing part 128. The calculating part 126 calculates information to be stored in a library of the storing part 127. The calculating part 126 calculates the height of the pattern, for example, based on known information such as the optical constant of the resist, the pattern form of the resist, the structure and so on, and further calculates calculatory light intensity distributions of the reflected lights reflected from a plurality of virtual patterns having different heights. The storing part 127 stores the calculatory light intensity distributions for the virtual patterns calculated by the calculating part 126 to create a library of them also including the information of the heights of patterns.

The light intensity distribution for an actual pattern on the wafer W measured by the measuring part 124 is outputted to the analyzing part 128. The analyzing part 128 collates the light intensity distribution on the actual pattern outputted from the measuring part 124 with the light intensity distributions on the virtual patterns stored in the library of the storing part 127, selects a virtual pattern having a matched light intensity distribution, and assumes the height of the virtual pattern as the height H of the actual pattern to thereby measure the height H of the pattern.

Next, the configurations of the resist coating units 40, 41 and 42 will be described. The resist coating unit 40 has, for example, a casing 40a whose inside can be closed as shown in FIG. 4. At the central portion of the casing 40a, a spin chuck 141 for holding and rotating the wafer W is provided. The spin chuck 141 has a horizontal upper surface and is provided with, for example, a suction port (not shown) for sucking the wafer W. The suction through the suction port allows the wafer W to be held on the spin chuck 141.

The spin chuck 141 can rotate at a predetermined speed by means of a chuck drive mechanism 142 equipped with, for example, a motor or the like. The chuck drive mechanism 142 is provided with a raising and lowering drive source such as a cylinder and thus can vertically move the spin chuck 141.

Around the spin chuck 141, a cup 143 is provided which receives and collects liquid splashing or dropping from the wafer W. A drain pipe 144 for draining the collected liquid and an exhaust pipe 145 for exhausting the atmosphere in the cup 143 are connected to the bottom surface of the cup 143. The exhaust pipe 145 is connected to a negative pressure generator (not shown) such as a pump and can forcibly exhaust the atmosphere in the cup 143.

Above the wafer W, a nozzle 146 is provided which discharges the resist solution. The nozzle 146 can freely move in the horizontal direction and in the vertical direction by means of a drive mechanism (not shown).

Note that the configurations of the resist coating units 41 and 42 are the same as that of the above-described resist coating unit 41, and therefore description will be omitted.

The height H of the pattern on the wafer W measured in the pattern measuring unit 20 is outputted, for example, to a control unit 130 of the coating and developing treatment system 1 shown in FIG. 1. The control unit 130 controls the number of rotations of the wafer W in the resist coating unit 40 (the number of rotations of the spin chuck 141 in the resist coating unit 40) based on the acquired height H of the pattern. For example, when the height H of the pattern exceeds a permissible value of the wafer W, a correction value for the number of rotations of the wafer W is calculated to increase the number of rotations of the wafer W in the resist coating unit 40. On the other hand, when the height H of the pattern is below the permissible value of the wafer W, the correction value for the number of rotations of the wafer W is calculated to decrease the number of rotations of the wafer W in the resist coating unit 40.

The control unit 130 is, for example, a computer which has a program storage unit (not shown). The program storage unit stores, for example, a program which controls the number of rotations of the wafer W in the resist coating unit 40. In addition, the program storage unit also stores a program for controlling the operations of the drive system such as the above-described various treatment and processing units and transfer bodies to realize later-described predetermined operations in the coating and developing treatment system 1, that is, the application of the resist solution to the wafer W, the development, the heat processing, the delivery of the wafer W, the control of the units and so on. Note that this program may be stored, for example, in a computer-readable recording medium such as a hard disk, a compact disk, a magneto-optical disk, and a memory card, and installed from the recording medium into the control unit 130.

The coating and developing treatment system 1 according to this embodiment is configured as described above, and wafer processing performed in this coating and developing treatment system 1 will be described next.

First of all, an unprocessed wafer W is taken out of the cassette C on the cassette mounting table 6 by the wafer transfer unit body 8 shown in FIG. 1, and transferred to the delivery unit 10 in the processing station 3. The wafer W delivered to the delivery unit 10 is transferred by the wafer transfer unit 12 to the temperature regulating unit 70 included in the third processing unit group G3 in the processing station 4. The wafer W transferred to the temperature regulating unit 70 is temperature-regulated to a predetermined temperature and then transferred by the first transfer unit 30 to the bottom coating unit 43 in which an anti-reflection film is formed. The wafer W on which the anti-reflection film is formed is transferred by the first transfer unit 30 in sequence to the heat processing unit 102, the high-temperature thermal processing unit 75, and the high-precision temperature regulating unit 80, in each of which the wafer W is subjected to predetermined processing. Thereafter, the wafer W is transferred by the first transfer unit 30 to the resist coating unit 40.

The wafer W transferred to the resist coating unit 40 is first suction-held on the spin chuck 71 as shown in FIG. 4. Next, the nozzle 146 is moved to above the central portion of the wafer W. Thereafter, the wafer W on the spin chuck 141 is rotated by the chuck drive mechanism 142, and the resist solution is discharged from the nozzle 146 onto the wafer W. The resist solution on the wafer W is spread by the centrifugal force and forms a predetermined resist film on the front surface of the wafer W.

The wafer W on which the resist film is formed is transferred by the first transfer unit 30 to the pre-baking unit 81 and subjected to heat-processing, and then transferred by the second transfer unit 31 in sequence to the edge exposure unit 104 and the high-precision temperature regulating unit 93, in each of which the wafer W is subjected to predetermined processing. Thereafter, the wafer W is transferred by the wafer transfer body 111 in the interface section 5 to the aligner (not shown) in which a predetermined pattern is exposed on the resist film on the wafer W. The wafer W for which the exposure processing has been finished is transferred by the wafer transfer body 111 to the post-exposure baking unit 94 and subjected to predetermined processing.

After the thermal processing in the post-exposure baking unit 94 is finished, the wafer W is transferred by the second transfer unit 31 to the high-precision temperature regulating unit 81 and temperature-regulated. Thereafter, the wafer W is transferred to the developing treatment unit 30, where developing treatment is performed on the wafer W to form a pattern in the resist film. Thereafter, the wafer W is transferred by the second transfer unit 31 to the post-baking unit 85 and subjected to heat processing, and then transferred by the first transfer unit 30 to the high-precision temperature regulating unit 72 and temperature-regulated. The wafer W is then transferred by the first transfer unit 30 to the transition unit 71 and transferred by the wafer transfer unit 12 to the pattern measuring unit 20 in the inspection station 3. In the pattern measuring unit 20, later-described measurement, for example, of the height H of the pattern on the wafer W is performed.

The wafer W for which the measurement of, for example, the height H of the pattern has been finished in the pattern measuring unit 20 is delivered by the wafer transfer unit 12 to the delivery unit 10, and returned from the delivery unit 10 to the cassette C by the wafer transfer body 8, with which a series of pattern forming processing in the coating and developing treatment system 1 ends.

Figure 6:
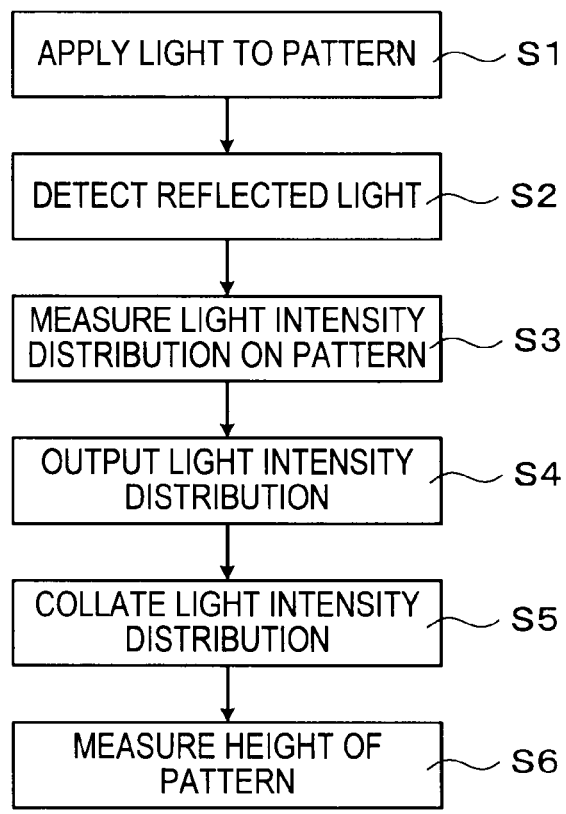
FIG. 6 A flow of a method of measuring a height of the pattern.

Next, the method of measuring the height H of the pattern formed on the wafer W performed in the pattern measuring unit 20 will be described. FIG. 6 shows a flow of the method of measuring the height H of the pattern. The wafer W transferred to the pattern measuring unit 20 is mounted on the mounting table 121 as shown in FIG. 4, and light is applied onto the pattern formed on the wafer W from the light applying part 122 (Step S1). The detecting part 123 detects reflected light from the pattern (Step S2). The measuring part 124 measures the light intensity distribution of the reflected light (Step S3). The light intensity distribution on the actual pattern is outputted to the control mechanism 125 (Step S4). In the control mechanism 125, the calculating part 126 has calculated in advance calculatory light intensity distributions for a plurality of virtual patterns, and the storing part 127 has stored the light intensity distributions for the virtual patterns to create a library of them. The analyzing part 128 collates the light intensity distribution on the actual pattern with the light intensity distributions on the virtual pattern in the library (Step S5). The height of the virtual pattern having a matched distribution is assumed to be the height H of the actual pattern. In this manner, the height H of the pattern on the wafer W is measured (Step S6). By using this method, the height H of the pattern can be measured by collation of the pattern using the library even when the pattern on the wafer W becomes finer.

The pattern height of the wafer W measured by the pattern measuring unit 20 is outputted to the control unit 130 as shown in FIG. 4. In the control unit 130, the correction value for the number of rotations of the wafer W is calculated to increase the number of rotations of the wafer W in the resist coating unit 40, for example, when the acquired height H of the pattern exceeds the permissible value of the wafer W. On the other hand, the correction value is calculated to decrease the number of rotations of the wafer W in the resist coating unit 40, for example, when the height H of the pattern is below the permissible value of the wafer W. The calculated correction value for the number of rotations of the wafer W is transmitted to the chuck drive mechanism 142 in the resist coating unit 40 so that the number of rotations of the wafer W can be controlled via the spin chuck 141.

According to the findings by the inventors, there is an almost constant correlation between the height H of the pattern on the wafer W and the film thickness of the resist film which has been conventionally measured. Accordingly, the correction value for the number of rotations of the wafer W in the resist coating unit 40 is calculated in the control unit 130 from the height H of the pattern using the correlation between the height H of the pattern and the film thickness after the resist solution has been applied. Therefore, it is unnecessary to measure the film thickness of the resist film.

As described above, according to the coating and developing treatment system 1 of this embodiment, the height H of the pattern formed on the wafer W can be measured by the pattern measuring unit 20, and the number of rotations of the wafer W in the resist coating unit 40 can be controlled by the control unit 130 based on the measurement result.

Accordingly, it is unnecessary, unlike the prior art, to transfer a test wafer through the coating and developing treatment system 1 and measure the film thickness of the resist film in order to control the number of rotations of the wafer W in the resist coating unit 40. Therefore, it is possible to eliminate the necessity of stopping the system for performing the photolithography processing for a product wafer to smoothly perform the predetermined processing on the wafer W, resulting in improved productivity of the wafer.

The measurement of the height H of the pattern on the wafer W as above can be performed for each wafer W. This gradually improves the accuracy of correction of the number of rotations of the wafer W in the resist coating unit 40 and increases the accuracy of the pattern to be formed on the wafer W for which the photolithography processing has been performed.

Though the pattern measuring unit 20 is provided inside the coating and developing treatment system 1 in the above embodiment, the pattern measuring unit 20 may be provided outside the coating and developing treatment system 1. In this case, the wafer W for which the predetermined treatment and processing in the coating and developing treatment system 1 have been finished and taken out of the cassette station 2 is subjected to measurement of the height H of its pattern by the pattern measuring unit 20 provided outside the coating and developing treatment system 1. Also in this case, the measurement result of the height H of the pattern on the wafer W is outputted to the control unit 130, whereby the correction value for the number of rotations of the wafer W in the resist coating unit 40 can be calculated in the control unit 130 to control the number of rotations of the wafer W as in the above-described embodiment.

While the number of rotations of the wafer W in the resist coating unit 40 is controlled based on the height H of the pattern on the wafer W measured by the pattern measuring unit 20 in the above embodiment, the film thickness of the anti-reflection film formed on the wafer W can also be measured at the same time in the pattern measuring unit 20 using the Scatterometry method. The anti-reflection film on the wafer W is formed by rotating the wafer W in the bottom coating unit 43 and applying an anti-reflection solution. Hence, the number of rotations of the wafer W in the bottom coating unit 43 which forms the anti-reflection film on the wafer W may be controlled based on the film thickness of the anti-reflection film measured by the pattern measuring unit 20 by the same method as in the above-described embodiment. For example, the measured film thickness of the anti-reflection film may be outputted to the control unit 130, and the correction value for the number of rotations of the wafer W in the bottom coating unit 43 may be calculated in the control unit 130 to control the number of rotations of the wafer W.

As for the control in the control unit 130, only the number of rotations of the wafer W is controlled in the above embodiment, but the control is not limited to the number of rotations but any one of the rotation time and the rotation acceleration of the wafer W may be controlled. Further, any two or three of the number of rotations, the rotation time, and the rotation acceleration may be controlled at the same time.

A preferred embodiment of the present invention has been described above with reference to the accompanying drawings, but the present invention is not limited to the embodiment. It should be understood that various changes and modifications within the scope of the spirit as set forth in claims are readily apparent to those skilled in the art, and those should also be covered by the technical scope of the present invention. The present invention is not limited to this embodiment but can employ various aspects. The present invention is also applicable to the case where the substrate is other substrates, for example, an FPD (flat panel display), a mask reticle for a photomask, and the like other than the wafer.

INDUSTRIAL APPLICABILITY

The present invention is useful in controlling at least one of the number of rotations, the rotation time, and the rotation acceleration of a substrate during the application in a unit which applies a resist film on the substrate in a system which processes the substrate such as, for example, a semiconductor wafer.

What is claimed:

1. A substrate processing method of performing photolithography processing on a substrate comprising steps of rotating the substrate and applying a coating solution onto the substrate, said method further comprising the steps of:

measuring a height of a predetermined pattern formed on the substrate; and controlling at least one of a number of rotations, a rotation time, and a rotation acceleration of the substrate in said step of applying the coating solution, based on the height of the predetermined pattern.

2. The substrate processing method as set forth in claim 1, wherein a Scatterometry method is used in said step of measuring the height of the predetermined pattern.

3. The substrate processing method as set forth in claim 1, wherein said step of measuring the height of the predetermined pattern comprises the following steps of:

applying light to the pattern formed on the substrate;

detecting reflected light from the pattern;

measuring a light intensity distribution of the reflected light;

collating the light intensity distribution of the reflected light with calculatory light intensity distributions for a plurality of virtual patterns for which a library has been created in advance; and assuming a height of a matched virtual pattern to be a height of an actual pattern.

4. The substrate processing method as set forth in claim 1, wherein said step of measuring the height of the predetermined pattern is performed for each substrate.

5. A non-transitory computer-readable storage medium comprising a program for causing a computer to control a substrate processing system when the system performs a substrate processing method comprising steps of rotating a substrate and applying a coating solution onto the substrate, said substrate processing method performing photolithography processing on the substrate and further comprising the following steps of:

measuring a height of a predetermined pattern formed on the substrate; and controlling one of a number of rotations, a rotation time, and a rotation acceleration of the substrate in said step of applying the coating solution, based on the height of the predetermined pattern.

6. A non-transitory computer-readable storage medium storing a program for causing a computer to control a substrate processing system when the system performs a substrate processing method comprising steps of rotating a substrate and applying a coating solution onto the substrate, said substrate processing method performing photolithography processing on the substrate and further comprising the following steps of:

measuring a height of a predetermined pattern formed on the substrate; and controlling one of a number of rotations, a rotation time, and a rotation acceleration of the substrate in said step of applying the coating solution, based on the height of the predetermined pattern.

7. A substrate processing system comprising a coating unit for rotating a substrate and applying a coating solution onto the substrate and a developing unit for developing a predetermined pattern on the substrate, said system further comprising:

a control unit for controlling at least one of a number of rotations, a rotation time, and a rotation acceleration of the substrate in said coating unit, based on a height of the predetermined pattern.

8. The substrate processing system as set forth in claim 7, further comprising:

a pattern measuring unit for measuring the height of the predetermined pattern, said pattern measuring unit being a unit for measuring the height of the pattern by a Scatterometry method.

9. The substrate processing system as set forth in claim 8, wherein said pattern measuring unit comprises a measuring part, a calculating part, a storing part and an analyzing part, wherein said measuring part measures a light intensity distribution for an actual pattern on the substrate, wherein said calculating part calculates the height of the pattern based on known information such as an optical constant of a resist, a pattern form of the resist, and a structure, and calculates calculatory light intensity distributions of reflected lights for a plurality of virtual patterns having different heights of patterns, wherein said storing part stores the light intensity distributions on the virtual patterns and the heights of the virtual patterns calculated by said calculating part, and wherein said analyzing part collates the light intensity distribution on the actual pattern measured by said measuring part with the light intensity distributions on the virtual patterns stored in said storing unit, and selects a virtual pattern having a matched light intensity distribution to assume the height of the virtual pattern to be a height of the actual pattern.

10. The substrate processing system as set forth in claim 8, wherein said pattern measuring unit is installed in said substrate processing system.

* * * * *